(12) United States Patent
Masuda et al.

(10) Patent No.: US 7,795,142 B2
(45) Date of Patent: Sep. 14, 2010

(54) METHOD FOR FABRICATING A SEMICONDUCTOR DEVICE

(75) Inventors: Hideaki Masuda, Kanagawa (JP); Hideshi Miyajima, Somers, NY (US); Toshiaki Idaka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 73 days.

(21) Appl. No.: 12/370,055

(22) Filed: Feb. 12, 2009

(65) Prior Publication Data
US 2009/0203201 A1    Aug. 13, 2009

(30) Foreign Application Priority Data
Feb. 13, 2008    (JP) .............................. 2008-031811

(51) Int. Cl.
*H01L 21/44* (2006.01)
(52) U.S. Cl. ................ 438/672; 438/637; 257/E21.577
(58) Field of Classification Search ................ 438/672, 438/618, 637; 257/E21.577, E21.585
See application file for complete search history.

(56) References Cited

U.S. PATENT DOCUMENTS

| | | | |
|---|---|---|---|
| 6,528,409 B1 * | 3/2003 | Lopatin et al. .............. 438/618 |
| 6,964,919 B2 * | 11/2005 | Kloster et al. ............... 438/626 |
| 7,125,793 B2 * | 10/2006 | Liou et al. ................... 438/637 |
| 7,557,035 B1 * | 7/2009 | Ryan et al. .................. 438/638 |
| 7,585,722 B2 * | 9/2009 | Edelstein et al. ............ 438/239 |
| 7,670,924 B2 * | 3/2010 | Demos et al. ............... 438/421 |
| 7,723,226 B2 * | 5/2010 | Yu et al. ..................... 438/618 |
| 2004/0130032 A1 | 7/2004 | Gronbeck et al. | |
| 2007/0232046 A1 | 10/2007 | Miyata et al. | |
| 2008/0054454 A1 | 3/2008 | Kagawa et al. | |

FOREIGN PATENT DOCUMENTS

JP    2004-274020    9/2004

* cited by examiner

*Primary Examiner*—Thao P. Le
(74) *Attorney, Agent, or Firm*—Finnegan, Henderson, Farabow, Garrett & Dunner, L.L.P.

(57) ABSTRACT

A method for fabricating a semiconductor device includes forming a dielectric film containing a porogen material above a substrate; removing a portion of the porogen material contained in the dielectric film so as to make a concentration of the porogen material higher in a part on a lower side of the dielectric film than in another part on a higher side of the dielectric film; forming an opening halfway in the dielectric film from which a portion of the porogen material has been removed to leave the dielectric film below a bottom of the opening; removing or polymerizing a remainder of the porogen material contained in the dielectric film; and etching the bottom of the opening after removing or polymerizing the remainder of the porogen material.

20 Claims, 9 Drawing Sheets

Excessive Etching    102

202

METHOD FOR FABRICATING A SEMICONDUCTOR DEVICE

CROSS-REFERENCE TO RELATED APPLICATION

This application is based upon and claims the benefit of priority from prior Japanese Patent Application No. 2008-031811 filed on Feb. 13, 2008 in Japan, the entire contents of which are incorporated herein by reference.

BACKGROUND OF THE INVENTION

1. Field of the Invention

The present invention relates to a method for fabricating a semiconductor device and, for example, relates to a fabricating method by which an opening is formed in a low dielectric constant dielectric film.

2. Related Art

In recent years, with ever higher integration and higher performance of semiconductor integrated circuits (LSI), new microprocessing technologies have been developed. In particular, to achieve an ever faster speed of LSI, there has been a growing trend recently to replace the conventional wire material of aluminum (Al) alloys with copper (Cu) or Cu alloys (hereinafter, called Cu together) having lower resistance. Since it is difficult to apply the dry etching method, which is frequently used for forming an Al alloy wire, to Cu for microprocessing, the so-called damascene process is mainly adopted for Cu, in which a Cu film is deposited on a dielectric film to which groove processing has been provided and then the Cu film is removed except in portions where the Cu film is embedded inside a groove by chemical-mechanical polishing (CMP) to form an embedded wire. The Cu film is generally formed as a laminated film to a thickness of about several hundred nm by the electro-plating method after a thin seed layer being formed by the sputter process. Further, when a multilayer Cu wire is formed, a dielectric film is deposited on a lower layer wire and a predetermined via hole is formed to embed Cu to be a plug material, which is further connected to an upper layer wire.

Then recently, the use of a low dielectric constant material film (low-k film) having a low relative dielectric constant is examined as an inter-level dielectric. That is, an attempt is made to reduce parasitic capacitance between wires by using a low dielectric constant material film (low-k film) whose relative dielectric constant k is 2.6 or less, instead of a silicon oxide film ($SiO_2$) whose relative dielectric constant k is about 4.2. Particularly, a process using a so-called porous dielectric film having minute holes in the dielectric film to make the dielectric constant lower has been developed. Then, when a Cu wire is formed by the above damascene process, a wire groove and a via hole need to be formed in the porous dielectric film by etching. At this point, a dielectric film of different film quality is formed on the under surface of the porous dielectric film as an etching stopper film to suppress the amount of etching. Normally, the etching stopper film has a higher relative dielectric constant than the porous dielectric film. Thus, a study of making the dielectric constant of the etching stopper film lower has been done to reduce capacitance between wires, but it is difficult to achieve both maintenance of film quality as an etching stopper and a lower dielectric constant. Thus, it is necessary to make the etching stopper film thinner to reduce capacitance between wires.

However, if the etching stopper film is made thinner, etching may not be stoppable by the etching stopper film in a wire or via plug shape process. This is because of a difference of the amount of etching due to a difference in pattern density. The etching stopper film may disappear for some patterns before a porous dielectric film is bored for all patterns so that the substrate, which is a base material, is unnecessarily etched. Thus, a problem of electric characteristics of wires in lower layers being adversely affected enormously is caused. If the etching stopper film is made thicker to avoid etching of the substrate, which is a base material, capacitance between wires increases, as described above, and if, on the other hand, the etching stopper film is made thinner, there is a possibility that the substrate, which is a base material, may also be etched. Thus, both making the etching stopper film thinner and thicker has respective problems, necessitating other process technology development to further reduce capacitance between wires.

Here, a technology to convert first and second spare porous dielectric layers into porous layers after forming the second spare porous dielectric layer containing a second porogen on the first spare porous dielectric layer containing a first porogen and etching a trench in the second spare porous dielectric layer and a via hole in the first spare porous dielectric layer is disclosed. A difference in etching between layers in this case should be realized by the use of porogen in each dielectric layer (for example, United States Patent Application Publication No. US2004/0130032). However, in this technology, only an interlayer etching difference between a layer in which a trench is formed and that in which a via hole is formed is described and suppression of an etching difference due to a difference in pattern density of patterns in one layer is not intended. Moreover, even if an attempt is made to apply the technology to patterns in one layer, a problem that two dielectric layers of different conditions must be laminated remains to be solved.

BRIEF SUMMARY OF THE INVENTION

In accordance with one aspect of the present invention, a method for fabricating a semiconductor device is provided, which includes forming a dielectric film containing a porogen material above a substrate; removing a portion of the porogen material contained in the dielectric film so as to make a concentration of the porogen material higher in a part on a lower side of the dielectric film than in another part on a higher side of the dielectric film; forming an opening halfway in the dielectric film from which a portion of the porogen material has been removed to leave the dielectric film below a bottom of the opening; removing or polymerizing a remainder of the porogen material contained in the dielectric film; and etching the bottom of the opening after removing or polymerizing the remainder of the porogen material.

DETAILED DESCRIPTION OF THE INVENTION

In an embodiment shown below, a method for fabricating a semiconductor device that suppresses an etching difference due to a difference in pattern density will be described.

Embodiment 1

An embodiment 1 will be described below with reference to the drawings.

Figure 1:
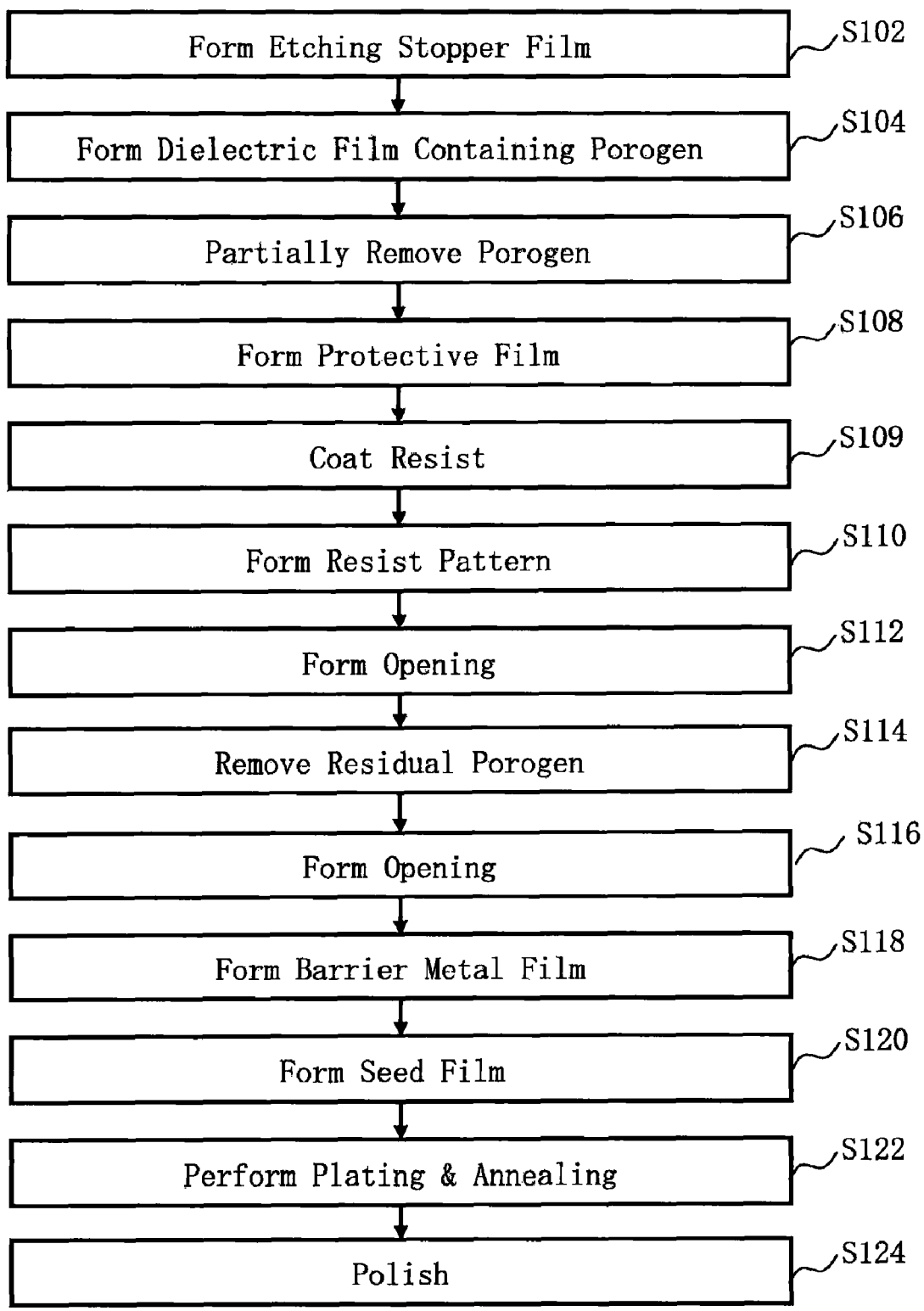
FIG. 1 is a flow chart showing principal parts of a method for fabricating a semiconductor device in an embodiment 1.

FIG. 1 is a flow chart showing principal parts of a method for fabricating a semiconductor device in the embodiment 1. In FIG. 1, the method for fabricating a semiconductor device according to the embodiment 1 performs a series of processes including an etching stopper film formation process (S102), a porogen containing dielectric film formation process (S104), a porogen partial removal process (S106), a protective film formation process (S108), a resist coating process (S109), a resist pattern formation process (S110), an opening formation process (S112), a residual porogen removal process (S114), an opening formation process (S116), a barrier metal film formation process (S118), a seed film formation process (S120), a plating & annealing process (S122), and a polishing process (S124).

FIG. 2A to FIG. 2D are process sectional views showing processes performed corresponding to the flow chart in FIG. 1. FIG. 2A to FIG. 2D show the etching stopper film formation process (S102) to the protective film formation process (S108) in FIG. 1.

Figure 2A:
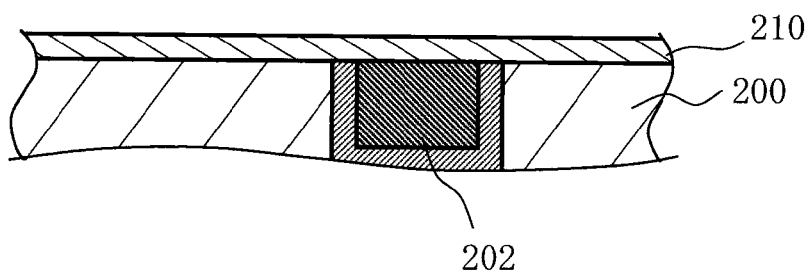
FIG. 2A to FIG. 2D are process sectional views showing processes performed corresponding to the flow chart in FIG. 1.

In FIG. 2A, as the etching stopper film formation process (S102), an etching stopper film 210 is formed on a substrate 200 by the chemical vapor deposition (CVD) method to a thickness of, for example, 25 nm. The thickness of the etching stopper film 210 is made thinner than that of an SiOC film 220 described later. For example, silicon carbonitride (SiCN), silicon carbooxide (SiCO), silicon carbide (SiC), or silicon nitride (SiN) is a suitable material for the etching stopper film 210. When these materials are used as a monolayer or lamination, the relative dielectric constant of the etching stopper film 210 becomes larger than that of the SiOC film 220 described later. The formation method thereof is not limited to the CVD method and the etching stopper film 210 may be formed by other methods. A silicon wafer of, for example, 300 mm in diameter is used as the substrate 200. Here, a case in which a metal wire 202 is formed in the substrate 200 is shown. An illustration of a contact plug layer, a device portion and the like below the metal wire 202 is omitted. On the substrate 200, layers having various semiconductor elements (not shown) such as metal wires and contact plugs or a structure may be formed. Or, other layers may be formed.

Figure 2B:
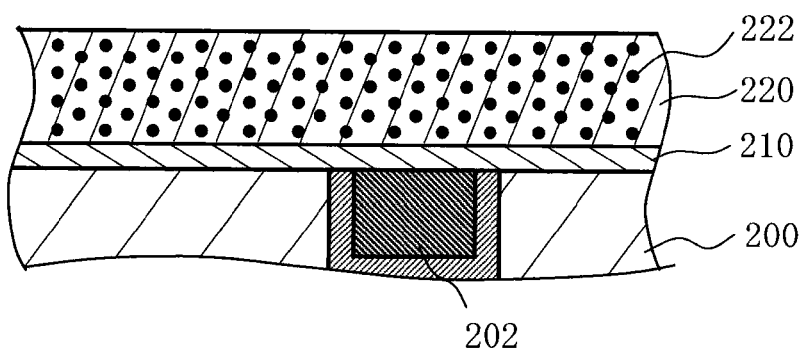

In FIG. 2B, as the porogen containing dielectric film formation process (S104), the SiOC film 220 containing a porogen material 222 therein is formed on the etching stopper film 210 by the PE-CVD method to a thickness of, for example, 300 nm. A mixed gas composed of methyl-di-ethoxy-silane, alpha-terpinene ($C_{10}H_{16}$), oxygen ($O_2$), and helium (He) is passed into a chamber (not shown) and while the pressure in the chamber is maintained, for example, at $1.3 \times 10^3$ Pa (10 Torr) or below, the substrate 200 on which the etching stopper film 210 is formed is heated, for example, to 250° C. and radio frequency power is supplied to a lower electrode and an upper electrode (not shown) in the chamber to generate plasma. Methyl-di-ethoxy-silane is a gas for main skeleton component formation and alpha-terpinene is a gas for porogen component formation. From these gases, the SiOC film 220 having organic siloxane as a main skeleton component is formed in the etching stopper film 210. At this point, alpha-terpinene contained in the mixed gas is polymerized by plasma to form an organic polymer. The organic polymer is the porogen material 222, which is incorporated into the SiOC film 220 uniformly.

As an organic silicon gas for main skeleton component formation, at least one of di-methyl-silane, tri-methyl-silane, tetra-methyl-silane, di-methyl-phenyl-silane, tri-methyl-silyl-acetylene, mono-methyl-di-ethoxy-silane, di-methyl-di-ethoxy-silane, tetra-methyl-cyclo-tetra-siloxane, and octo-methyl-cyclo-terta-siloxane can be used.

As a gas for porogen component formation, at least one of methane, ethylene, propylene, alpha-terpinene, gamma-terpinene, and limonene can be used.

Here, the SiOC film 220 is formed by the CVD method, but the formation method is not limited to the CVD method. For example, the SOD (spin on dielectric coating) method is preferably used, by which a thin film is formed by spin-coating a solution containing a porogen material and providing heat treatment. For example, methyl silsesquioxane (MSQ) can be used as a material of a low dielectric constant dielectric film formed by the SOD method. In addition to MSQ, for example, a low dielectric constant dielectric film may be formed by using at least one material selected from a group including a film having siloxane backbone structures such as polymethyl siloxane, polysiloxane, and hydrogen silsesquioxane and a porous film such as a porous silica film. When the SOD method is used, for example, the SiOC film 220 having, for example, organic siloxane as a main skeleton component in which the porogen material 222 is uniformly contained can be formed by forming a film by a spinner and baking the formed wafer in a nitrogen atmosphere on a hot plate. A low dielectric constant of less than 2.5 can be obtained by using any material of low dielectric constant dielectric film.

Figure 2C:
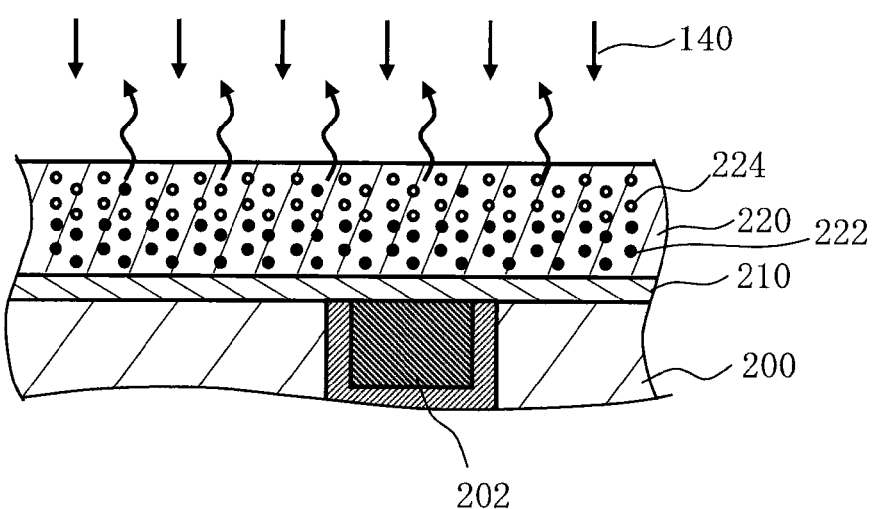

In FIG. 2C, as the porogen partial removal process (S106), a portion of the porogen material 222 contained in the SiOC film 220 is removed by irradiation of an electron beam. Also, hardening of main skeleton components contained in the SiOC film 220 is suitably promoted by irradiation of an electron beam. More specifically, while the substrate 200 on which the SiOC film 220 is formed is maintained inside a chamber (not shown) at, for example, $1.3 \times 10^3$ Pa (10 Torr) or below, the substrate 200 is heated, for example, to 400° C. Next, an argon (Ar) gas is made to flow into the chamber so that the pressure inside the chamber is maintained constant. After the pressure becomes constant, the SiOC film 220 is irradiated with an electron beam 140. Here, the SiOC film 220 is irradiated with the electron beam 140 of incident energy weaker than conventional incident energy to remove the entire porogen material 222 in the SiOC film 220. Accordingly, a portion of the porogen material 222 is removed as air bubbles so that, as shown in FIG. 2C, a state in which the concentration of the porogen material 222 is higher in a part on the lower half side or "undersurface side" of the SiOC film 220 than in a whole part on the higher half side or "top surface side" of the SiOC film 220 can be formed. Holes 224 are generated in a portion from which the porogen material 222 is removed. Thus, a porous SiOC film is formed particularly in the whole part on the higher half side of the SiOC film 220. For example, a region of a high concentration of the porogen material 222 is suitably formed on the lower half side of the SiOC film 220 with a thickness thinner than the lower half of the SiOC film 220.

Figure 3:
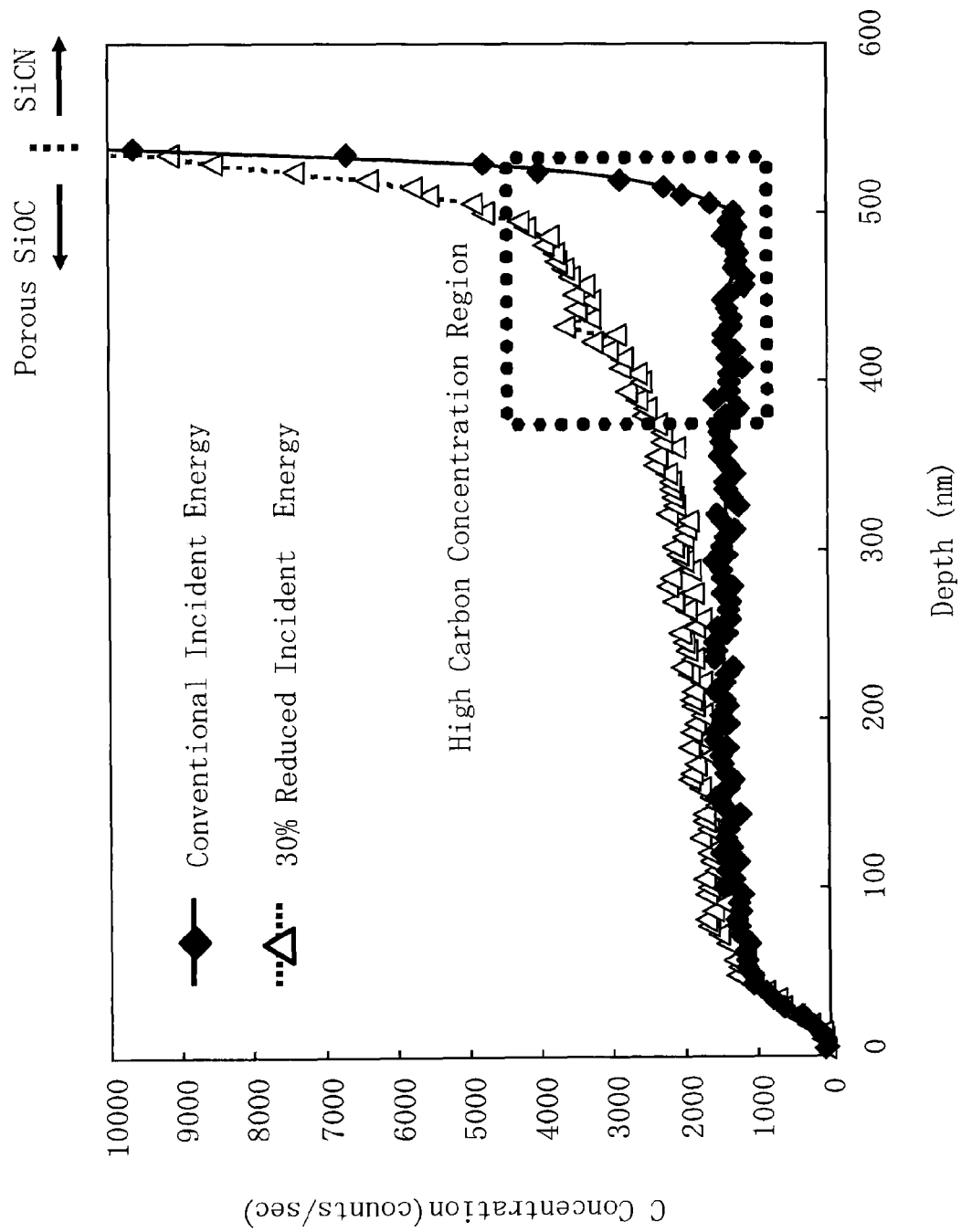
FIG. 3 is a diagram exemplifying relationships between a carbon concentration and a film depth after irradiation of an electron beam in the embodiment 1.

FIG. 3 is a diagram exemplifying relationships between a carbon concentration and a film depth after irradiation of an electron beam in the embodiment 1. In FIG. 3, relationships between a carbon concentration and the film depth are shown when the SiOC film 220 of the thickness 550 nm in which the porogen material 222 is uniformly contained is irradiated with an electron beam of conventional incident energy and that of 30% reduced incident energy. Here, the electric field strength of 4.8 kV/cm and the amount of irradiated electrons of 100 μC/cm$^2$ are used as an example of conventional incident energy to be a reference. FIG. 3 shows carbon concentration profile results in a porous SiOC film by secondary ion mass segregation analysis (SIMS analysis). It is clear that, by reducing incident energy by 30%, a region of about 250 nm in an interface between the porous SiOC film and an SiCN film to be the etching stopper film 210 in which the concentration becomes higher than that of the conventional example in regular order is present. It is clear that 100 nm is particularly a high carbon concentration region with a wide difference from the conventional example.

Figure 4:
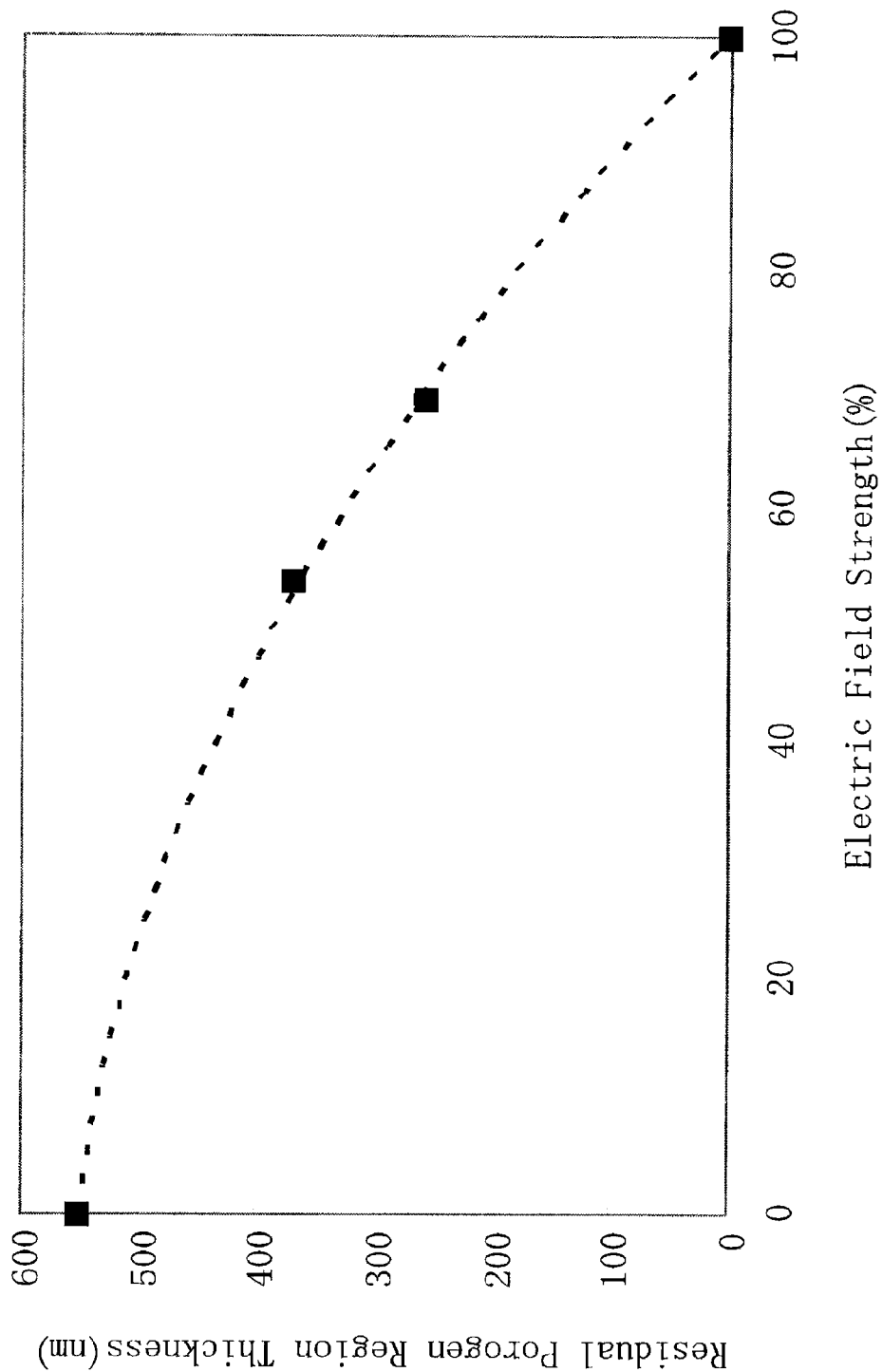
FIG. 4 is a diagram exemplifying relationships between a proportion of electric field strength of the electron beam and a thickness of a residual porogen region in the embodiment 1.

FIG. 4 is a diagram exemplifying relationships between the proportion of electric field strength of the electron beam and the thickness of a residual porogen region in the embodiment 1. In FIG. 4, an example of thickness of the residual porogen region is shown when the electric filed strength is lowered by setting incident energy of a conventional electron beam to the SiOC film 220 of the thickness 550 nm in which the porogen material 222 is uniformly contained is set at 100%. If, for example, the electric field strength is reduced as incident energy by 30%, like FIG. 3, it is clear that a porogen residual region of about 250 nm in an interface between the porous SiOC film and the SiCN film to be the etching stopper film 210 is present. This result roughly matches the thickness of the region in which the concentration becomes higher than that of the conventional example in regular order in FIG. 3.

Thus, the inventors found that, by reducing incident energy, a high carbon concentration region can be generated on the under surface side of the SiOC film 220. Thus, based on the experimental result, a region with a high carbon concentration is formed in an interface between the porous SiOC film 220 and the SiCN film by adjusting incident energy of irradiated electrons to control porogen residual distribution in the depth direction. In this manner, a region with a different carbon concentration can be formed in a single layer film (one layer) without forming a laminated film. Then, the etching selection ratio can be changed within one film by forming a region with a high carbon concentration in a single layer film. The carbon concentration ratio between the lower region and upper region of the SiOC film 220 may suitably be adjusted. A region in the lower part of at least three times the carbon concentration ratio to that in the upper part of the SiOC film 220 is more preferably formed.

Figure 2D:
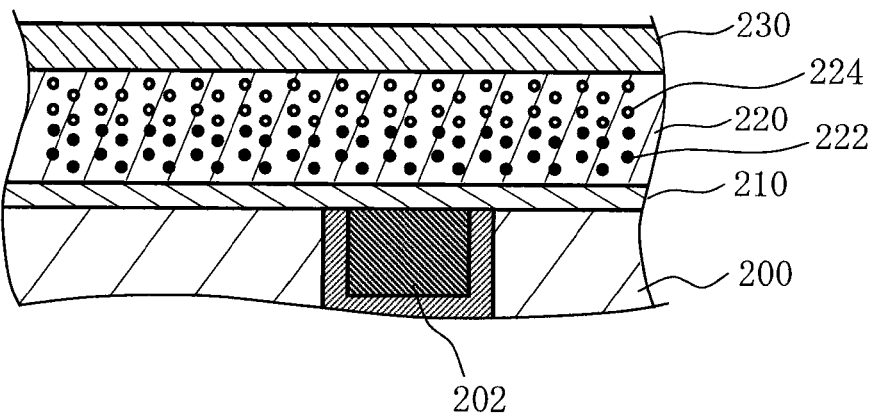

In FIG. 2D, as the protective film formation process (S108), a protective film 230 is formed on the porous SiOC film 220 having a high carbon concentration region in the lower part thereof by the CVD method to a thickness of, for example, 30 nm. An SiN film, SiO$_2$ film, SiCN film, SiCO film, SiC film, or dense SiOC film is suitable as a material of the protective film 230. Here, any dielectric film that is different in composition from the porous SiOC film 220 or has a higher density than the porous SiOC film 220 may be used. Since ultraviolet irradiation in the residual porogen removal process (S114) described later destroys the carbon to carbon bond and a resist mask is removed during the ultraviolet irradiation, it is effective to form at least one layer of the protective film 230 to be a mask material in the opening formation process (S116) described later between the resist mask and the porous SiOC film 220.

Here, depending on the protective film 230, the protective film 230 may be formed subsequent to the porogen containing dielectric film formation process (S104) before a portion of the porogen material 222 contained in the SiOC film 220 being removed by irradiation of an electron beam as the porogen partial removal process (S106). By adjusting the film density or thickness of the protective film 230, the porogen material 222 can be removed as air bubbles through the protective film 230. In this case, because incident electrons into the SiOC film 220 in the porogen partial removal process (S106) are decelerated by the protective film 230, an electron beam into the SiOC film 220 results in weakened incident energy. Therefore, considering a portion of weakened incident energy of an electron beam by the protective film 230, the electric field strength during irradiation of the electron beam may be reduced when necessary.

Instead of the dielectric film, the protective film 230 can use a metal such as tantalum (Ta), titanium (Ti), ruthenium (Ru), tungsten (W), zirconium (Zr), aluminum (Al), and niobium (Nb), nitride of one of these metals including tantalum nitride (TaN), titanium nitride (TiN), and tungsten nitride (WN), or an alloy containing at least one of these metals as a material. As the deposition method of these metal films, the PVD method, the atomic layer deposition (ALD) method (or the atomic layer chemical vapor deposition (ALCVD) method) or the CVD method can be used. Particularly when a metal film is used for the protective film 230, using the same material as the material used for a barrier metal film described later is more preferred.

Figure 5A:
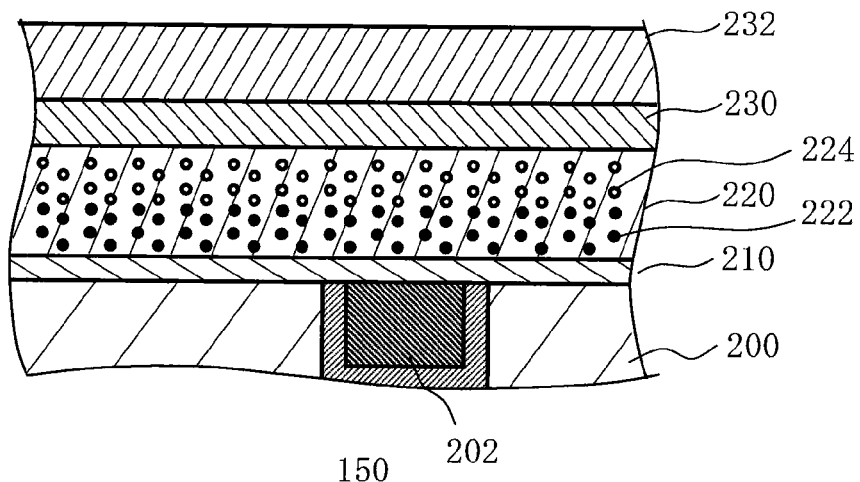
FIG. 5A to FIG. 5C are process sectional views showing processes performed corresponding to the flow chart in FIG. 1.
Figure 5B:
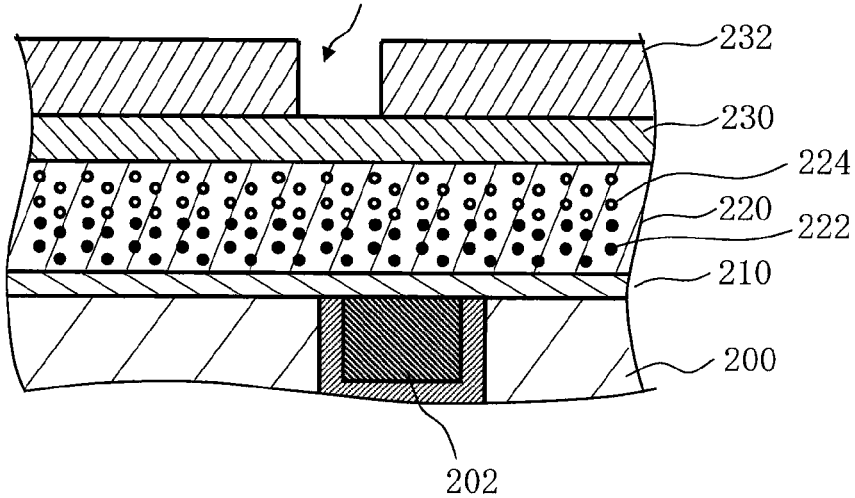
Figure 5C:
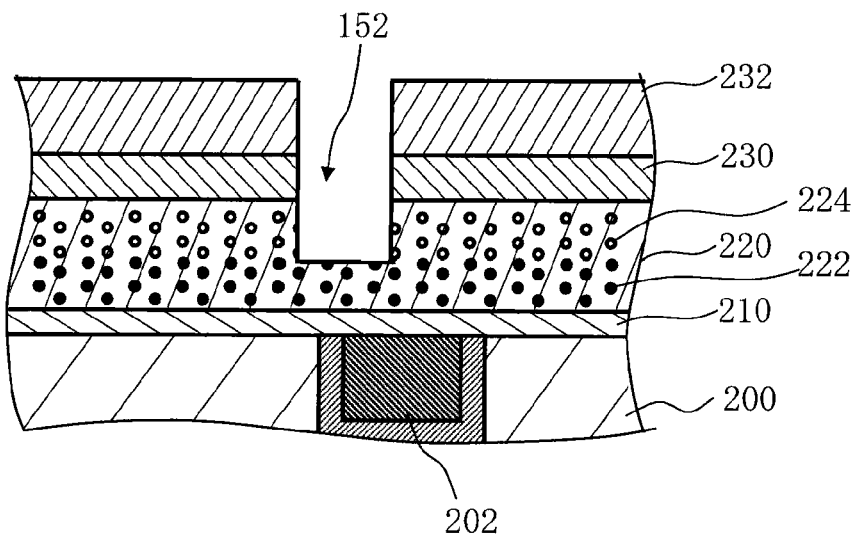

FIG. 5A to FIG. 5C are process sectional views showing processes performed corresponding to the flow chart in FIG. 1. FIG. 5A to FIG. 5C show the resist coating process (S109) to the opening formation process (S112) in FIG. 1.

In FIG. 5A, as the resist coating process (S109), the protective film 230 is coated with a resist film 232.

In FIG. 5B, as the resist pattern formation process (S110), a resist pattern to be a via hole pattern is formed on the protective film 230 through a lithography process such as an exposure process to selectively form an opening 150.

In FIG. 5C, as the opening formation process (S112), an opening 152 to be an upper portion of a via hole is formed by selectively etching the exposed protective film 230 and the porous SiOC film 220 there under by the anisotropic etching method using a resist pattern as a mask. In this case, etching is not performed till the etching stopper film 210 is reached and instead, etching is stopped halfway through etching in such a manner that a high carbon concentration region at the bottom of the porous SiOC film 220 is left to form the opening 152. Here, a condition of the etching rate of the porous SiOC film 220 being dependent on the carbon concentration in the film is used. A fluorine gas, for example, at least one $C_xH_yF_z$ (x, z: an integer equal to 1 or greater; y: an integer equal to 0 or greater) gas and an inert gas are suitably used as an etching gas. By using the anisotropic etching method for removal, the opening 152 can be formed substantially perpendicularly to the surface of the substrate 200. As an example, the opening 152 may be formed by the reactive ion etching (RIE) method.

The upper part of the porous SiOC film 220 is now made a low carbon concentration region by the porogen partial removal process (S106) and, on the other hand, the lower part is a high carbon concentration region and thus, the etching rate slows down in the high carbon concentration region and, as shown in FIG. 5C, etching can be stopped by the high carbon concentration region in which a large amount of the porogen material 222 remains acting as an etching stopper. At this point, while the high carbon concentration region of a pattern location reaching the high carbon concentration region first being etched due to a difference of pattern area density, the high carbon concentration region of remaining pattern locations is reached so that a difference of the amount of etching due to a difference of pattern area density can be cleared away or reduced.

Figure 6A:
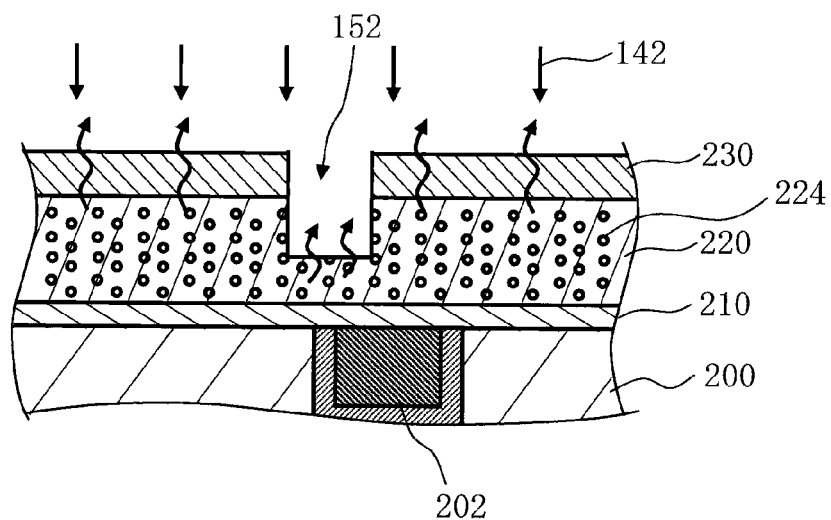
FIG. 6A to FIG. 6C are process sectional views showing processes performed corresponding to the flow chart in FIG. 1.
Figure 6B:
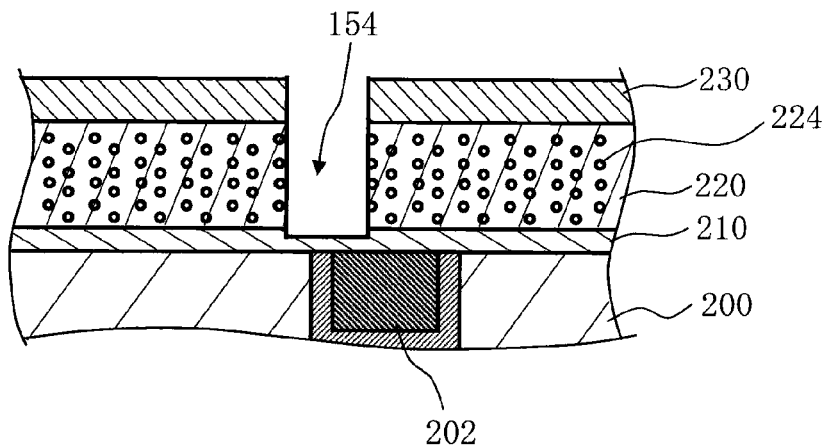
Figure 6C:
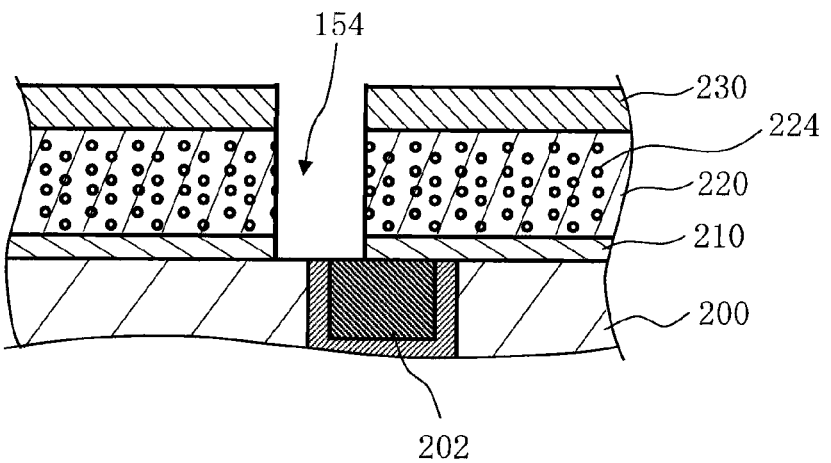

FIG. 6A to FIG. 6C are process sectional views showing processes performed corresponding to the flow chart in FIG. 1. FIG. 6A to FIG. 6C show the residual porogen removal process (S114) to the opening formation process (S116) in FIG. 1.

In FIG. 6A, as the residual porogen removal process (S114), the residual porogen material 222 contained in the porous SiOC film 220 is removed by ultraviolet irradiation. While the substrate 200 on which the porous SiOC film 220 is formed is maintained inside a chamber (not shown) at, for example, $1.3 \times 10^3$ Pa (10 Torr) or below, the substrate 200 is heated, for example, to 400° C. Next, an Ar gas is made to flow into the chamber so that the pressure inside the chamber is maintained constant. After the pressure becomes constant, the porous SiOC film 220 protected by the protective film 230 is irradiated with ultraviolet rays 142. Here, the porous SiOC film 220 protected by the protective film 230 is irradiated with the ultraviolet rays 142 having a wavelength region of 200 nm to 600 nm. The remainder of the porogen material 222 is thereby removed as air bubbles and, as shown in FIG. 6A, the porogen material 222 remaining in the porous SiOC film 220, particularly the porogen material 222 remaining in a part on the undersurface side near the interface of the etching stopper film 210 is removed. The holes 224 are generated in a portion from which the porogen material 222 is removed. Accordingly, the porous SiOC film 220 in which the holes 224 are uniformly distributed as a whole can be formed. Moreover, the carbon to carbon bond is destroyed by ultraviolet irradiation so that the resist film 232 can also be removed together.

Instead of or in addition to removal of the residual porogen material 222, a polymerization reaction of porogen components or between porogen components and main skeleton components may be caused. For example, by adjusting the film density or film thickness of the protective film 230 to make it harder for the porogen material 222 as air bubbles to penetrate through the protective film 230, the porogen material 222 is made harder to be removed except that near the opening 152 so that, after being turned into air bubbles, a polymerization reaction can be caused in the porous SiOC film 220. In this case, the dielectric constant increases slightly to the extent that the entire porogen material 222 is not removed, but this method is effective in that the porous SiOC film 220 of excellent film quality can be obtained resulting from a polymerization reaction of the residual porogen material 222.

Here, ultraviolet irradiation is also provided, but the present embodiment is not limited to this. For example, the residual porogen material 222 may also be suitably removed by irradiation of an electron beam, heating treatment, oxidizing gas treatment, reducing gas treatment, or chemical treatment. Or, such treatment may be combined like heating treatment and irradiation of an electron beam, heating treatment and oxidizing gas treatment, or heating treatment and reducing gas treatment when appropriate. In irradiation of an electron beam, for example, incident energy in the porogen partial removal process (S106) need not be reduced for irradiation. In heating treatment, the SiOC film 220 may be heated to 350° C. or more. In oxidizing gas treatment, for example, the substrate 200 may be exposed, after being heated, to oxygen ($O_2$), carbon dioxide ($CO_2$), vapor ($H_2O$), or a mixed gas containing these. In reducing gas treatment, for example, the substrate 200 may be exposed, after being heated, to hydrogen ($H_2$), ammonia ($NH_3$), carbon monoxide (CO), or a mixed gas containing these. In the present embodiment, as described above, a combination of heating treatment and ultraviolet irradiation is described as an example. By combining a plurality of treatments such as heating treatment and ultraviolet irradiation in this manner, the treatment time can be reduced. By reducing the treatment time, damage to a wire layer in the foundation can be reduced.

In FIG. 6B, as the opening formation process (S116), an opening 154 extending to a lower portion of the via hole is formed by selectively etching the bottom of the opening 152 of the exposed porous SiOC film 220 by the anisotropic etching method for removal using the protective film 230 as a hard mask. Here, etching is performed under conditions so that an adequate etching selection ratio of the porous SiOC film 220 can be obtained using the etching stopper film 210 as an etching stopper. A fluorine gas, for example, at least one CxHyFz (x, z: an integer equal to 1 or greater; y: an integer equal to 0 or greater) gas and an inert gas are suitably used as an etching gas. By using the anisotropic etching method for removal, the opening 154 can be formed substantially perpendicularly to the surface of the substrate 200. As an example, the opening 154 may be formed by the RIE method.

At this point, by using the protective film 230 that can be made thinner than the resist film 232 as a hard mask for etching, dimensional accuracy of the opening 154 can be improved. A different of the amount of etching due to a difference of pattern area density has already been cleared away or reduced and further, the remaining thickness of the bottom of the opening 152 is thin, yielding a small amount of etching. Moreover, the etching rate of the porous SiOC film 220 at the bottom of the opening 152 has been made faster by irradiation of ultraviolet rays in the residual porogen removal process (S114) and thus, while the etching stopper film 210 of a pattern location reaching the etching stopper film 210 first due to a difference of pattern area density being etched, remaining pattern locations can be made to reach the etching stopper film 210. Therefore, the etching stopper film 210 in a certain pattern location can be prevented from being etched through to perform unnecessary etching of the substrate 200 thereunder. Then, by performing etching of the remaining etching stopper film 210 thereafter, as shown in FIG. 6C, the opening 154 is completed.

Figure 7A:
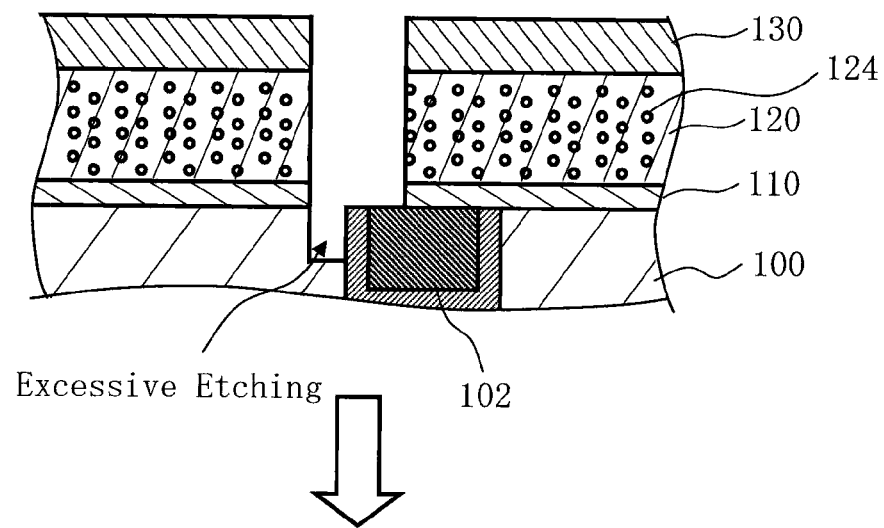
FIG. 7A and FIG. 7B are conceptual diagrams illustrating a difference between an opening formed by a conventional technique and that formed by a technique in the embodiment 1.
Figure 7B:
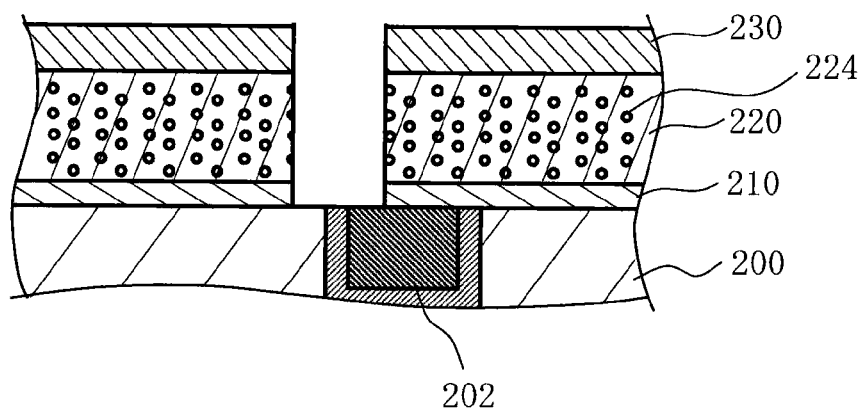

FIG. 7A and FIG. 7B are conceptual diagrams illustrating a difference between an opening formed by a conventional technique and that formed by a technique in the embodiment 1. Conventionally, holes 124 are uniformly formed by removing all porogens in an SiOC film 120 and then, an opening is formed using a resist film 130 as a pattern and thus, as shown in FIG. 7A, there is a possibility that an etching stopper 110 is etched through to perform excessive etching of a side of a wire 102 of a substrate 100. In contrast, in the embodiment 1, after the SiOC film 220 in which the porogen material 222 is approximately uniformly distributed being formed, the distribution of the porogen material 222 in the film can be changed by irradiation of an electron beam. As a result, a high carbon concentration region can be formed in the lower part of the SiOC film 220. Then, while the porogen concentration in the lower part of the SiOC film 220 being made higher, etching is performed halfway through an opening and next, after the remaining porogen material 222 in the SiOC film 220 being removed, the remaining bottom of the opening is etched using the protective film 230 as a mask. Accordingly, as shown in FIG. 7B, the etching stopper film 210 can be prevented from being etched through to perform excessive etching of the side of the wire 202 of the substrate 200. Thus, the need to make the etching stopper film 210 thicker can be eliminated and process control of the via plug shape can be made easier without increasing capacitance between wires. Or, the etching stopper film 210 can be made thinner to reduce capacitance between wires.

Figure 8A:
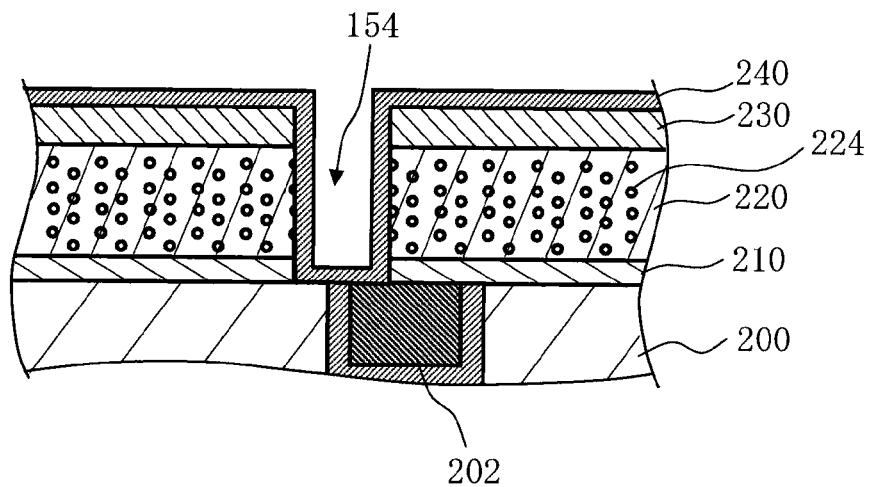
FIG. 8A and FIG. 8B are process sectional views showing processes performed corresponding to the flow chart in FIG. 1.
Figure 8B:
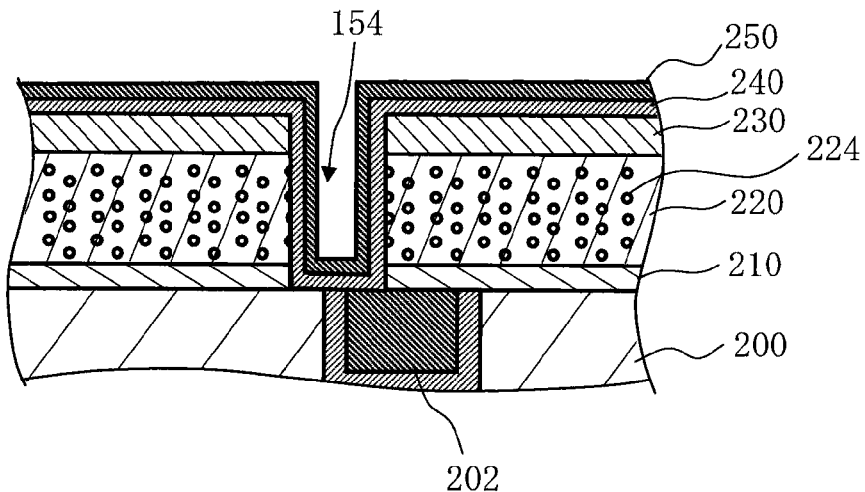

FIG. 8A and FIG. 8B are process sectional views showing processes performed corresponding to the flow chart in FIG. 1. FIG. 8A and FIG. 8B show the barrier metal film formation process (S118) to the seed film formation process (S120) in FIG. 1.

In FIG. 8A, as the barrier metal film formation process (S118), a barrier metal 240 using a barrier metal material as an example of conductive material is formed on the inner surface of the opening 154 formed by etching and on the surface of the protective film 230. A TaN film is deposited in a sputtering apparatus using the sputter process to a thickness of, for example, 5 nm to form the barrier metal film 240. The deposition method of the barrier metal material is not limited to the PVD method and the atomic layer deposition method or the CVD method can also be used. The coverage factor can be made better than when the PVD method is used. In addition to TaN, Ta, Ti, W, TiN, WN, or a laminated film of a combination of these such as Ta and TaN can be used as the material of the barrier metal film. Or, like when the protective film 230 is formed from a metal film, a metal such as Ru, Zr, Al, and Nb, or nitride of these metals can be used.

In FIG. 8B, as the seed film formation process (S120), a Cu thin film to be a cathode electrode in the next process, the plating & annealing process, is deposited (formed) as a seed film 250 on the inner surface of the opening 154 where the barrier metal film 240 is formed and on the surface of the substrate 200 by the physical vapor deposition (PVD) method such as the sputter process.

Figure 9A:
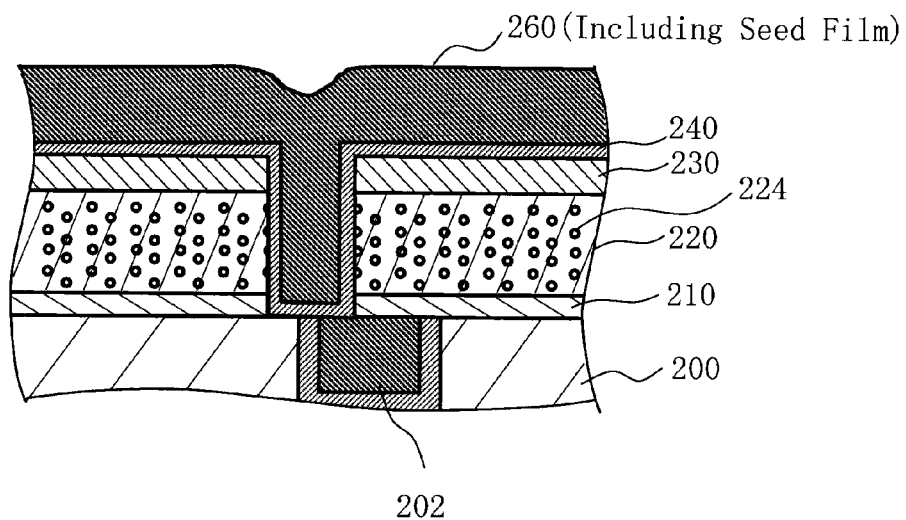
FIG. 9A and FIG. 9B are process sectional views showing processes performed corresponding to the flow chart in FIG. 1.
Figure 9B:
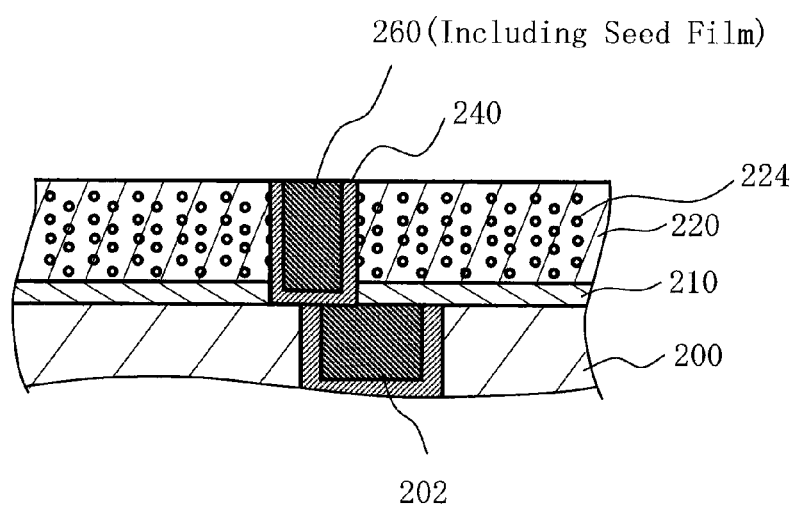

FIG. 9A and FIG. 9B are process sectional views showing processes performed corresponding to the flow chart in FIG. 1. FIG. 9A and FIG. 9B show the plating & annealing process (S122) and the polishing process (S124) in FIG. 1.

In FIG. 9A, as the plating & annealing process (S122), a Cu film 260 to be an example of conductive material is deposited on the surface of the opening 154 and the substrate 200 where the seed film 250 is formed with the seed film 250 as the cathode electrode by the electrochemical growth method such as electro-plating. Here, for example, the Cu film 260 is deposited to a thickness of 200 nm and then, after the deposition, annealing is performed, for example, at 250° C. for 30 min.

In FIG. 9B, as the polishing process (S124), the surface of the substrate 200 is polished by the CMP method to remove the Cu film 260 including the seed film 250 to be a wire layer, the barrier metal 240, and the protective film 230 deposited on the surface excluding the opening by polishing. By polishing the conductive material in this manner, the conductive material is selectively left in the opening 154 where the barrier metal film 240 is formed on the inner surface thereof. As a result, as shown in FIG. 9B, the surface can be planarized. According to the foregoing, a via plug can be formed on the Cu wire 202.

Here, if a dielectric film is used as the protective film 230, the protective film 230 may be left on the SiOC film 220 in the polishing process (S124). If, on the other hand, a metal film is used as the protective film 230, the protective film 230 is polished to remove the protective film 230. Particularly, if the protective film 230 is formed from the same material as the barrier metal film 240, the barrier metal film 240 and the protective film 230 of a metal film can be polished together. Here, the Cu film 260 deposited in the opening 154 is also polished when the barrier metal film 240 is polished and thus, the polishing liquid used for polishing such as slurry and the cleaning liquid used for cleaning after polishing are adjusted so that corrosion caused by a potential difference generated between dissimilar metals of the barrier metal material and Cu is not generated. On the other hand, if the protective film 230 is formed from a different material from the barrier metal material, there arises a need to adjust the polishing liquid and cleaning liquid among three dissimilar materials. Adjustments among three dissimilar materials are very difficult. Thus, if the barrier metal film 240 and the protective film 230 of a metal film are formed from the same material, adjustments between two dissimilar materials that are easier to achieve suffice.

According to the present embodiment, as described above, a difference of the amount of etching due to a difference in pattern density can be made smaller. Thus, unnecessary etching of the substrate can be prevented.

In the above description, the same effect can be obtained, even if in addition to Cu, as a material of the wire layer in the above embodiment, a material having Cu as a main component used in the semiconductor industry such as a Cu—Sn alloy, Cu—Ti alloy, and Cu—Al alloy is used.

In the foregoing, an embodiment has been described with reference to concrete examples. However, the present invention is not limited to these concrete examples. For example, the above examples describe a case of forming a via hole, but the present invention can similarly be applied when a trench is formed. Moreover, the protective film 230 may be removed by a method other than the CMP method. For example, the protective film 230 may be removed by chemical treatment.

Further, the thickness of inter-level dielectric, the size, shape, and number of openings and the like may be used by selecting appropriately what is needed for semiconductor integrated circuits and various semiconductor elements.

In addition, all semiconductor devices and methods for fabricating semiconductor devices having elements of the present invention and whose design can be modified as needed by those skilled in the art are included in the scope of the present invention.

Though techniques normally used in the semiconductor industry, for example, a photolithography process and cleaning before and after treatment are omitted for simplification of the description, such techniques are naturally included in the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for fabricating a semiconductor device, comprising:
   forming a dielectric film containing a porogen material above a substrate;
   removing a portion of the porogen material contained in the dielectric film so as to make a concentration of the porogen material higher in a part on a lower side of the dielectric film than in another part on a higher side of the dielectric film;
   forming an opening halfway in the dielectric film from which a portion of the porogen material has been removed to leave the dielectric film below a bottom of the opening;
   removing or polymerizing a remainder of the porogen material contained in the dielectric film; and
   etching the bottom of the opening after removing or polymerizing the remainder of the porogen material.

2. The method according to claim 1, wherein the portion of the porogen material is removed by irradiating the dielectric film with an electron beam.

3. The method according to claim 1, further comprising: forming a predetermined film above the dielectric film, wherein
   the opening is formed halfway in the dielectric film using a resist pattern formed above the predetermined film as a mask and
   after the resist pattern is removed, the bottom of the opening is etched using the predetermined film as a mask.

4. The method according to claim 3, wherein the remainder of the porogen material is removed or polymerized by irradiating the dielectric film, above which the predetermined film is formed, with an ultraviolet ray.

5. The method according to claim 4, wherein when the remainder of the porogen material is removed or polymerized, the resist pattern formed above the predetermined film is removed by the irradiating.

6. The method according to claim 1, further comprising: forming an etching stopper film for etching the bottom of the opening above the substrate before the dielectric film being formed.

7. The method according to claim 6, wherein a relative dielectric constant of the etching stopper film is larger than that of the dielectric film.

8. The method according to claim 7, wherein a thickness of the etching stopper film is thinner than that of the dielectric film.

9. The method according to claim 6, wherein at least one of silicon carbonitride (SiCN), silicon carbooxide (SiCO), silicon carbide (SiC), and silicon nitride (SiN) is used as a material for the etching stopper film.

10. The method according to claim 2, wherein incident energy of the electron beam is made weaker than that needed for removing the entire porogen material contained in the dielectric film.

11. The method according to claim 1, wherein a region of a relatively high concentration of the porogen material is formed with a thickness less than a lower half of the dielectric film when the portion of the porogen material is removed.

12. The method according to claim 1, wherein a low carbon concentration region is formed in the another part on the higher side of the dielectric film and a high carbon concentration region is formed in the part on the lower side of the dielectric film by removing the portion of the porogen material.

13. The method according to claim 12, wherein the low carbon concentration region is selectively removed so as to leave the high carbon concentration region of the dielectric film when the opening is formed.

14. The method according to claim 13, wherein the opening is formed by etching, when the opening is formed, the etching is stopped by the high carbon concentration region acting as an etching stopper.

15. The method according to claim 3, wherein the predetermined film is different from the dielectric film in composition or has a higher density than the dielectric film.

16. The method according to claim 15, wherein an SiN film, $SiO_2$ film, SiCN film, SiCO film, SiC film, or dense SiOC film is used as a material of the predetermined film.

17. The method according to claim 3, wherein a metal, nitride of the metal, or an alloy containing the metal is used as a material of the predetermined film.

18. The method according to claim 17, wherein at least one of tantalum (Ta), titanium (Ti), ruthenium (Ru), tungsten (W), zirconium (Zr), aluminum (Al), and niobium (Nb) is used as the metal.

19. The method according to claim 3, wherein the remainder of the porogen material is removed or polymerized by irradiating the dielectric film, above which the predetermined film is formed, with an electron beam.

20. The method according to claim 3, wherein the bottom of the opening is etched using the predetermined film that is thinner than the resist pattern as a mask.

* * * * *